United States Patent [19]

Adachi

[11] Patent Number: 5,287,320
[45] Date of Patent: Feb. 15, 1994

[54] TIMING COINCIDING CIRCUIT SIMULTANEOUSLY SUPPLYING TWO POWER SUPPLY VOLTAGES APPLIED IN DIFFERENT TIMING

[75] Inventor: Yukinobu Adachi, Hyogo, Japan

[73] Assignee: Mitsubishi Denki Kabushiki Kaisha, Tokyo, Japan

[21] Appl. No.: 846,115

[22] Filed: Mar. 5, 1992

[30] Foreign Application Priority Data

Jun. 4, 1991 [JP] Japan .................. 3-132924

[51] Int. Cl.⁵ .................. G11C 11/34; H01L 23/58
[52] U.S. Cl. .................. 365/226; 365/227; 365/230.06; 365/233; 365/189.09; 365/193
[58] Field of Search .................. 365/226, 227, 230.06, 365/233, 189.09, 193

[56] References Cited

U.S. PATENT DOCUMENTS 5,073,874 12/1991 Yamada et al. .................. 365/193 X
5,132,931 7/1992 Koker .................. 365/233 X
5,132,932 7/1992 Tobita .................. 365/233 X

FOREIGN PATENT DOCUMENTS

4115082A1 11/1991 Fed. Rep. of Germany.

OTHER PUBLICATIONS

Elektronik 1/11, Jan. 1985, S. 67 and 68.

Primary Examiner—Eugene R. LaRoche
Assistant Examiner—Huan Hoang
Attorney, Agent, or Firm—Lowe, Price, LeBlanc & Becker

[57] ABSTRACT

An improved DRAM includes a main circuit and an output driver circuit, respectively, energized by externally applied two power supply voltages. The DRAM includes a timing coinciding circuit for making the supply-timing of the two power supply voltages to the circuits coincided to each other. When power supply voltage only is applied, output driver circuit has a tendency to consume an excessive penetrating current in response to an unstable output signal provided from main circuit. Even though the two power supply voltages are applied in different timing, the excessive current consumption in the output driving circuit is avoided, since timing coinciding circuit simultaneously starts and ends the supply of output power supply voltages.

12 Claims, 9 Drawing Sheets

TIMING COINCIDING CIRCUIT SIMULTANEOUSLY SUPPLYING TWO POWER SUPPLY VOLTAGES APPLIED IN DIFFERENT TIMING

BACKGROUND OF THE INVENTION

1. Field of the Invention

The present invention generally relates to semiconductor integrated circuit devices and semiconductor memory devices and, more particularly, to a semiconductor integrated circuit device and a semiconductor memory device comprising two internal circuits respectively energized by two power supply voltages which can be applied in different timing. The present invention has a particular applicability to Dynamic Random Access Memories (DRAMs) having multi-bits configurations.

2. Description of the Background Art

Recently, high integration of a semiconductor memory has been realized, and storage capacity of the semiconductor memory has been increased. The demand for the semiconductor memory having multi-bits configuration is increased as the storage capacity increases. The semiconductor memory having multi-bits configuration can handle data, for example in 1 byte (8 bits) or in 2 bytes (16 bits) unit. It means that the semiconductor memory having multi-bits configuration can simultaneously read and write a plurality of bits of data.

Generally, a number of semiconductor memories are placed on a printed circuit board (memory board), and their data output terminals are connected to data buses. Accordingly, when data stored in a semiconductor memory is read out, the semiconductor memory drives a data bus (load) connected to a data output terminal in response to the read out data signal. In order to drive the data bus, the semiconductor memory comprises at its output stage a driving circuit for driving the data bus. Generally, the load which must be driven by the driving circuit is large, since the long data bus is provided on the memory board. Therefore, the driving circuit is constructed by a transistor having large current driving capability.

Since the driving circuit provided in the semiconductor memory needs to drive such a large load as mentioned above, it consumes much current, i.e., power. When a signal power supply voltage is supplied not only to the primary circuits constituting the semiconductor memory, namely, a memory cell array and a sense amplifier, but to the driving circuit, a power supply voltage level is decreased by current consumption in the driving circuit. The decrease of the power supply voltage causes malfunction of the main circuits in the semiconductor memory. Recently, for the purpose of preventing the decrease of the power supply voltage supplied to the primary circuits, additional power supply voltage for the driving circuit is applied to the semiconductor memory. Therefore, although the driving circuit consumes much current, malfunction of the main circuits in the semiconductor memory caused by that current consumption can be avoided.

Furthermore, the semiconductor memory supplied with two power supply voltages also has an advantage in view of noise control as mentioned in the following description. When a single power supply voltage is supplied, it is difficult to transmit noise in the semiconductor memory to the power supply, that is, noise hardly escapes, since impedance of a gold line connected between a power supply lead and a bonding pad formed in the semiconductor substrate is high. Therefore, in this case, peripheral circuits in the semiconductor memory are easily affected by noise. However, when two or more power supply voltages are supplied, noise is easily transmitted to the power supply, that is, from the semiconductor memory to outside (noise easily escapes), since the total impedance of two or more gold lines is decreased. As a result, peripheral circuits in the semiconductor memory are rarely affected by noise.

In view of the advantages mentioned above, two or more power supply voltages are applied to recent semiconductor memories having multi-bits configurations. A plurality of power supply voltages are supplied to the semiconductor memory through a plurality of power supply lines provided on the memory board, but their timings are often different from each other, because the plurality of power supply lines have different lengths and hence different impedances. As a result, even if a plurality of power supply voltages are simultaneously provided to the memory board, the timings of these power supply voltages supplied to the semiconductor memory often differ. It should be noted that, depending on the situation, there may be a case where one of a plurality of power supply voltages is not supplied because of some failure.

In the following description, at first, the semiconductor memory will be described. Next, there will be a description of possible problems caused when the timings of a plurality of power supply voltages differ, or when one of the power supply voltages is not applied. The present invention is generally applicable to the semiconductor memories, and a dynamic random access memory (referred to as "DRAM" hereinafter) will be described as one example in the following description.

FIG. 7 is a block diagram of a conventional DRAM. Referring to FIG. 7, the DRAM 1a comprises a main circuit 2a energized by an externally applied first power supply voltage Vcc 1, and an output driving circuit 4 energized by a second power supply voltage Vcc 2. Main circuit 2a comprises a memory cell array 60 including memory cells arranged in rows and columns, an address input buffer 63 for receiving externally applied address signals A0 to Am, a row decoder 61 for decoding a row address signal RA, a column decoder 62 for decoding a column address signal CA, and a sense amplifier 64 for amplifying data signals read out from memory cells. Sense amplifier 64 is connected to an output buffer circuit 3a and to an input latch circuit 65 through an IO line.

A clock signal generator 67 generates various control signals for controlling DRAM 1a in response to an externally applied row address strobe signal /RAS and a column address strobe signal /CAS. An OE buffer 68 receives an externally applied output enable signal /OE to provide a signal OEM. A power on reset circuit 69 is supplied with power supply voltage Vcc 1 to generate a power on reset signal (referred to as "POR" hereinafter).

Output driving circuit 4 is supplied with second power supply voltage Vcc 2 to drive a load connected to I/O terminals DQ1 to DQn, namely, a data bus DB in response to n-bit data signals generated from output buffer circuits 3a. I/O latch circuit 65 is connected to I/O terminals DQ1 to DQn through a bypass line bypassing output driving circuit 4.

In write operation, since a write enable signal /W falls, n-bit data signals applied through terminals DQ1 to DQn are latched in latch circuit 65. The latched signals are written into the memory cell designated by external address signals A0 to Am. In read operation, n-bit stored data signals are read out from the memory cell designated by external address signals A0 to Am. Output buffer circuit 3a applies n-bit data signals to output driving circuit 4 in response to output enable signal /OE. Output driving circuit 4 drives data bus DB connected to terminals DQ1 to DQn in response to the applied data signals.

FIG. 8 is a circuit diagram of an output main amplifier 3ai provided in an output buffer circuit 3a and a circuit 4i provided in output driving circuit 4 shown in FIG. 7. Circuits 3ai and 4i handle 1 bit read out data signal, namely, an ith data signal RDi. In other words, output buffer circuit 3a and output driving circuit 4 shown in FIG. 7 comprise n-circuits 3ai and 4i shown in FIG. 8.

Referring to FIG. 8, a first stage circuit 5 comprises PMOS transistors 11 and 12, and NMOS transistors 13 and 14 connected in series between power supply voltage Vcc 1 and ground Vss 1. The ith read out data signal RDi is applied to the gates of transistors 12 and 13 constituting an inverter. First stage circuit 5 is activated in response to data obtaining signals DOT and /DOT generated from clock signal generator 67 shown in FIG. 7, to apply read out data signal RDi to a latch circuit 6. Latch circuit 6 comprises two cross coupled CMOS inverters. One CMOS inverter is constituted by a PMOS transistor 15 and a NMOS transistor 16. The other CMOS inverter is constructed by a PMOS transistor 17 and an NMOS transistor 18. Latch circuit 6 applies mutually inverted two signals to a CMOS inverter constructed by a PMOS transistor 19 and an NMOS transistor 20, and to a CMOS inverter constructed by a PMOS transistor 21 and an NMOS transistor 22. These two signals provided from the two CMOS inverters are applied to output timing control circuits 7 and 8, respectively.

Output timing control circuit 7 is constructed by PMOS transistors 23 and 24, and NMOS transistors 25 and 26. When externally applied output enable signal /OE is at a low level, and OE buffer 68 shown in FIG. 7 provides a high level signal OEM. Transistors 24 and 25 are turned off and on, respectively, in response to signal OEM. Accordingly, at this time, output timing control circuit 7 transmits the signal applied to an input node N1 to CMOS inverter 9. When output enable signal /OE is at a high level, transistors 24 and 25 are turned on and off, respectively. Accordingly, at this time, circuit 7 applies a high level signal to inverter 9. Inverter 9 applies a low level signal S1 to driver circuit 4i in response to the applied high level signal.

Output timing control circuit 8 has the same circuit configuration and operates in the same manner as circuit 7. Accordingly, when a high level signal OEM is applied, circuit 8 applies to CMOS inverter 10 an inverted one of the signal applied to a node N2. Therefore, at this time, inverter 10 provides inverted signal S2 and applies it to driving circuit 4i. Since transistors 28 and 29 are turned on and off, respectively when signal OEM is at a low level, CMOS inverter 10 provides a low level signal S2.

Driving circuit 4i comprises NMOS transistors Q1 and Q2 connected in series between second power supply voltage Vcc 2 and ground Vss 2. A common connection node ccn of transistors Q1 and Q2 is connected to ith data I/O terminal DQi. When output enable signal /OE is at a low level, mutually inverted data signals S1 and S2 are applied to transistors Q1 and Q2, respectively, in response to a high level signal OEM. Consequently, either one of transistors Q1 and Q2 is turned on, and either one of the potential Vcc 2 and Vss 2 in response to ith read out data RDi is provided through terminal DQi.

When second power supply voltage Vcc 2 is applied without any supply of first power supply voltage Vcc 1, there will be a problem as mentioned in the following description. When first power supply voltage Vcc 1 is not applied, output signals S1 and S2 of inverters 9 and 10 indicate an unstable potential. Accordingly, conductive/non conductive state of transistors Q1 and Q2 in driving circuit 4i become unstable. As a result, current consumption is increased, because a penetrating current flows from power supply voltage Vcc 2 to ground Vss 2 through transistors Q1 and Q2. Depending on the situation, transistors Q1 and Q2 may be damaged because of excessive penetrating current.

FIG. 9 shows a timing chart indicating the flow of an excessive penetrating current when the supply of power supply voltages Vcc 1 and Vcc 2 starts. Referring to FIG. 9, the supply of power supply voltage Vcc 2 starts at the time t1, and then the supply of power supply voltage Vcc 1 starts at the time t2. Therefore, output signals S1 and S2 provided from output main amplifier circuit 3ai show unstable potential until the time t2. Since power supply voltage Vcc 1 is applied to output main amplifier 3ai after the time t2, the potential of the output signals S1 and S2 is established. Therefore, it should be noted that an excessive penetrating current Ip can flow through the transistors Q1 and Q2 in driving circuit 4i until the time when power supply voltage Vcc 1 rises (t2) after the end of the rise of power supply voltage Vcc 2 (t1).

FIG. 10 shows a timing chart indicating the flow of the excessive penetrating current when the supply of power supply voltages Vcc 1 and Vcc 2 ends. Referring to FIG. 10, the supply of power supply voltage Vcc 1 ends at the time t11, and then the supply of power supply voltage Vcc 2 ends at the time t14. Therefore, output signals S1 and S2 of output main amplifier circuit 3ai show unstable potential. As a result, excessive penetrating current Ip can flow through transistors Q1 and Q2 in driving circuit 4i in the period between the time t11 and t14.

SUMMARY OF THE INVENTION

One object of the present invention is to decrease a current consumed when power supply voltages are applied in different timing in a semiconductor integrated circuit device comprising two internal circuits, respectively energized by the externally applied at least two power supply voltages.

Another object of the present invention is to decrease a current consumed in a driving circuit for driving data output terminals when power supply voltages are applied in different timing in a semiconductor memory device, energized by the externally applied at least two power supply voltages.

Briefly stated, a semiconductor integrated circuit device of the present invention includes first and second internal circuits, respectively energized by the externally applied at least first and second power supply voltages. The second internal circuit has a tendency to consume much current in response to an unstable output signal provided from the first internal circuit when the second power supply voltage only is applied. The semiconductor integrated circuit device additionally includes a timing coinciding circuit responsive to the supply-timing of one of the first and second voltages for making the other supply-timing of the first and second power supply voltages coincide with the preceeding one. First and second power supply voltages are applied to first and second internal circuits through the timing coinciding circuit, respectively.

In operation, when first and second power supply voltages are applied in different timing, the timing coinciding means operates and simultaneously supplies the applied first and second power supply voltages to first and second internal circuits. Therefore, the second internal circuit is prevented from consuming much current in response to the unstable output signal provided from the first internal circuit.

In accordance with another aspect of the present invention, a semiconductor memory device includes a data storing circuit supplied with an externally applied first power supply voltage for storing a data signal, a data read out circuit supplied with the first power supply voltage, for reading out the data signal stored in the data storing circuit in response to an externally applied read out control signal, a data output terminal for providing the data signal read out from the data read out circuit, and a driving circuit supplied with the externally applied second power supply voltage for driving the data output terminal in response to the data signal read out by the data read out circuit. The driving circuit has a tendency to consume much current in response to an unstable output signal provided from the data read out circuit when the second power supply voltage only is applied. The semiconductor memory device additionally includes a timing coinciding circuit responsive to the supply-timing of one of the first and second voltages received for making the other supply-timing of the first and second power supply voltages coincide with the preceding one. The first and second power supply voltages are respectively applied to the data storing circuit and the data read out circuit, and the driving circuit through the timing coinciding circuit.

In operation, when the first and second power supply voltages are applied in different timing, the timing coinciding circuit operates and simultaneously supplies the applied first and second power supply voltages respectively to the data storing circuit and the data read out circuit, and the driving circuit. Therefore, the driving circuit is prevented from consuming much current in response to the unstable output signal provided from the data read out circuit.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 2:
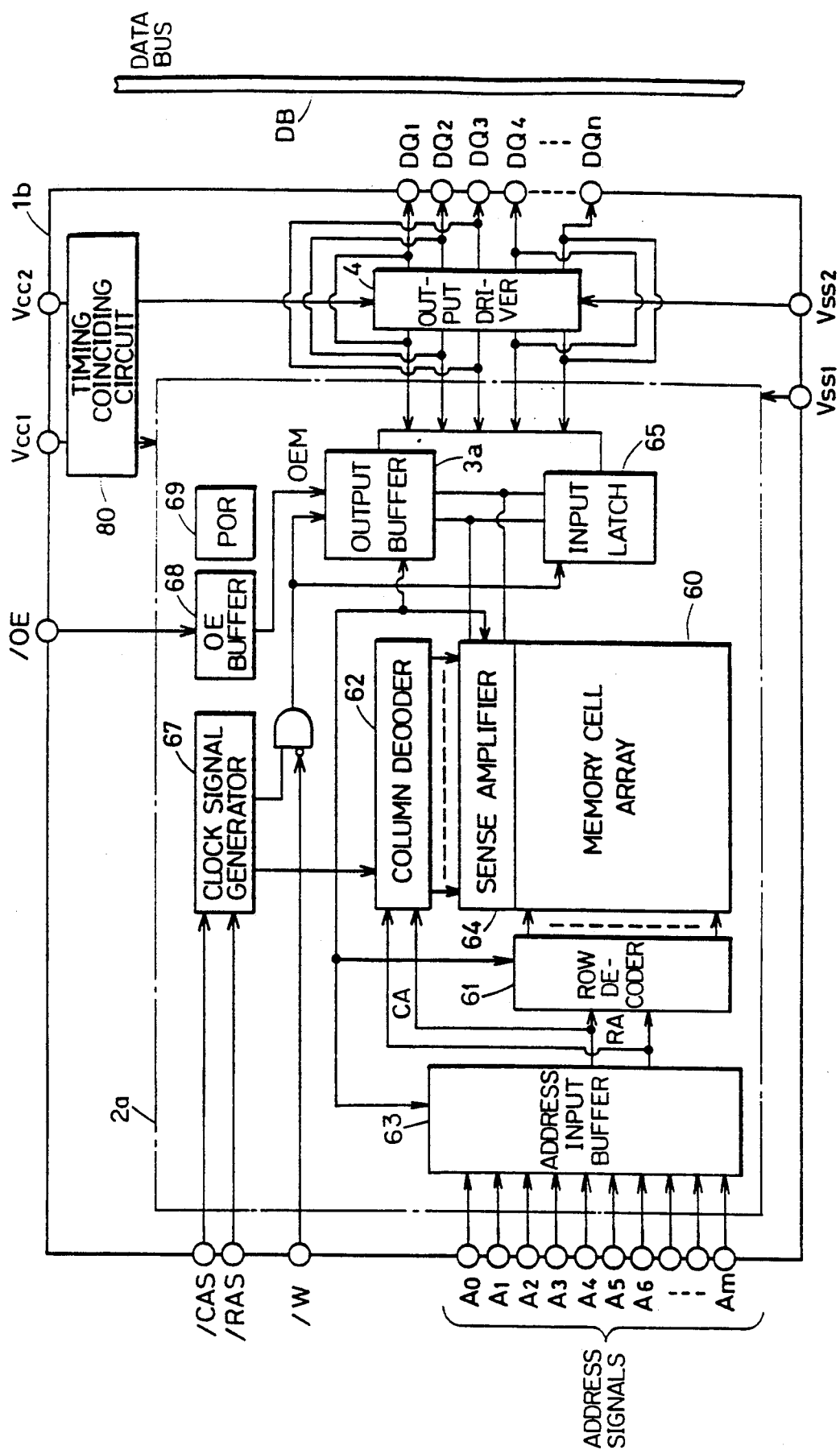
FIG. 2 is a block diagram of a DRAM showing one embodiment of the present invention.
Figure 7:
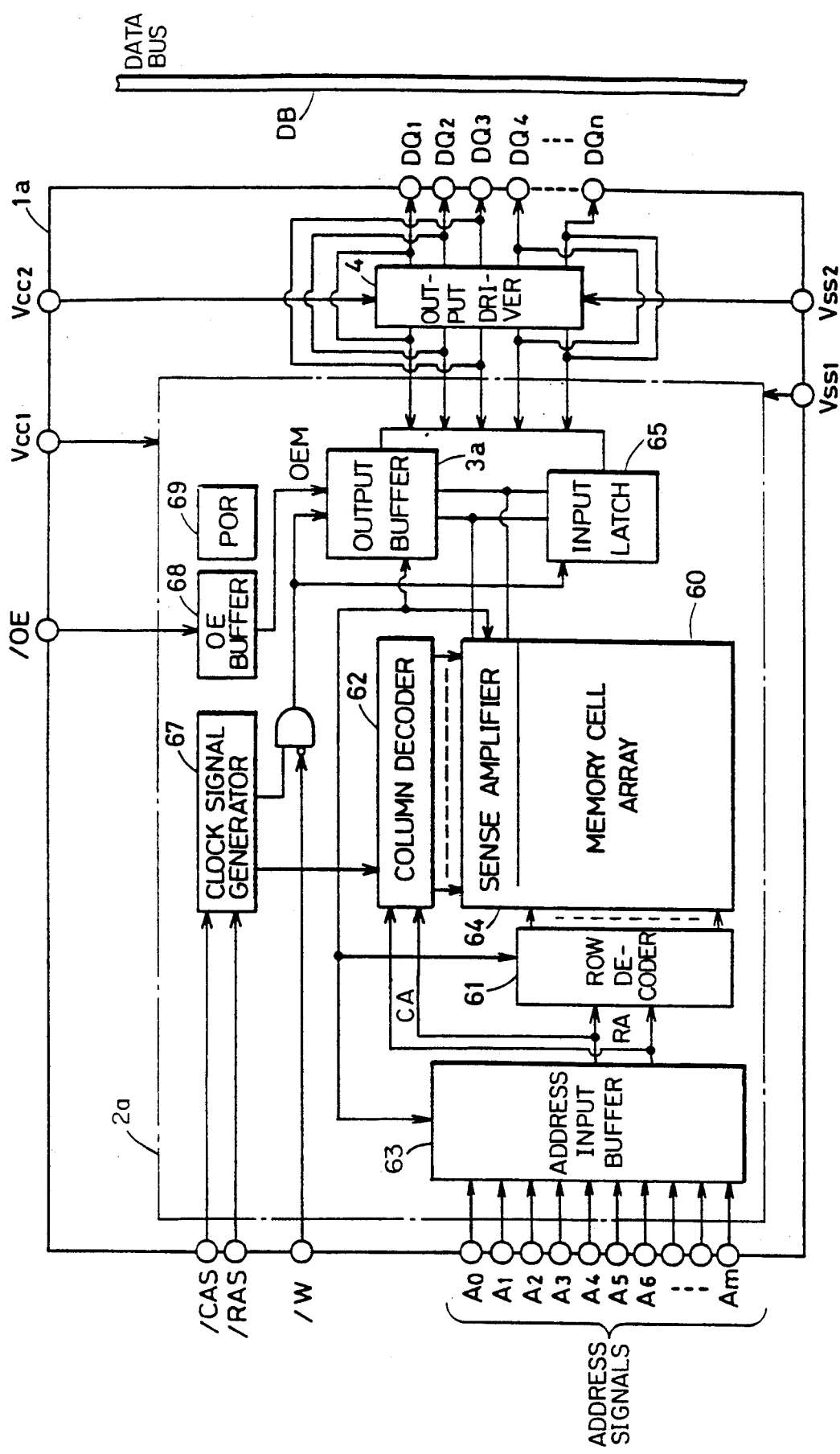
FIG. 7 is a block diagram of a conventional DRAM.

Referring to FIG. 2, the DRAM 1b comprises a newly provided timing coinciding circuit 80 as compared with the conventional one 1a shown in FIG. 7. Timing coinciding circuit 80 receives the externally applied first and second power supply voltages Vcc1 and Vcc2, and simultaneously provide them to a main circuit 2a and an output driver 4, respectively. As shown in FIG. 2, main circuit 2a comprises a memory cell array 60, a row decoder 61, a column decoder 62, a sense amplifier 64, and an output main amplifier circuit 3ai provided in an output buffer 3a (shown in FIG. 8). Since DRAM 1b shown in FIG. 2 has the same circuit configuration with the conventional DRAM 1a shown in FIG. 7 except for the timing coinciding circuit 80 and operates in the same manner, the description will not be repeated.

Figure 1:
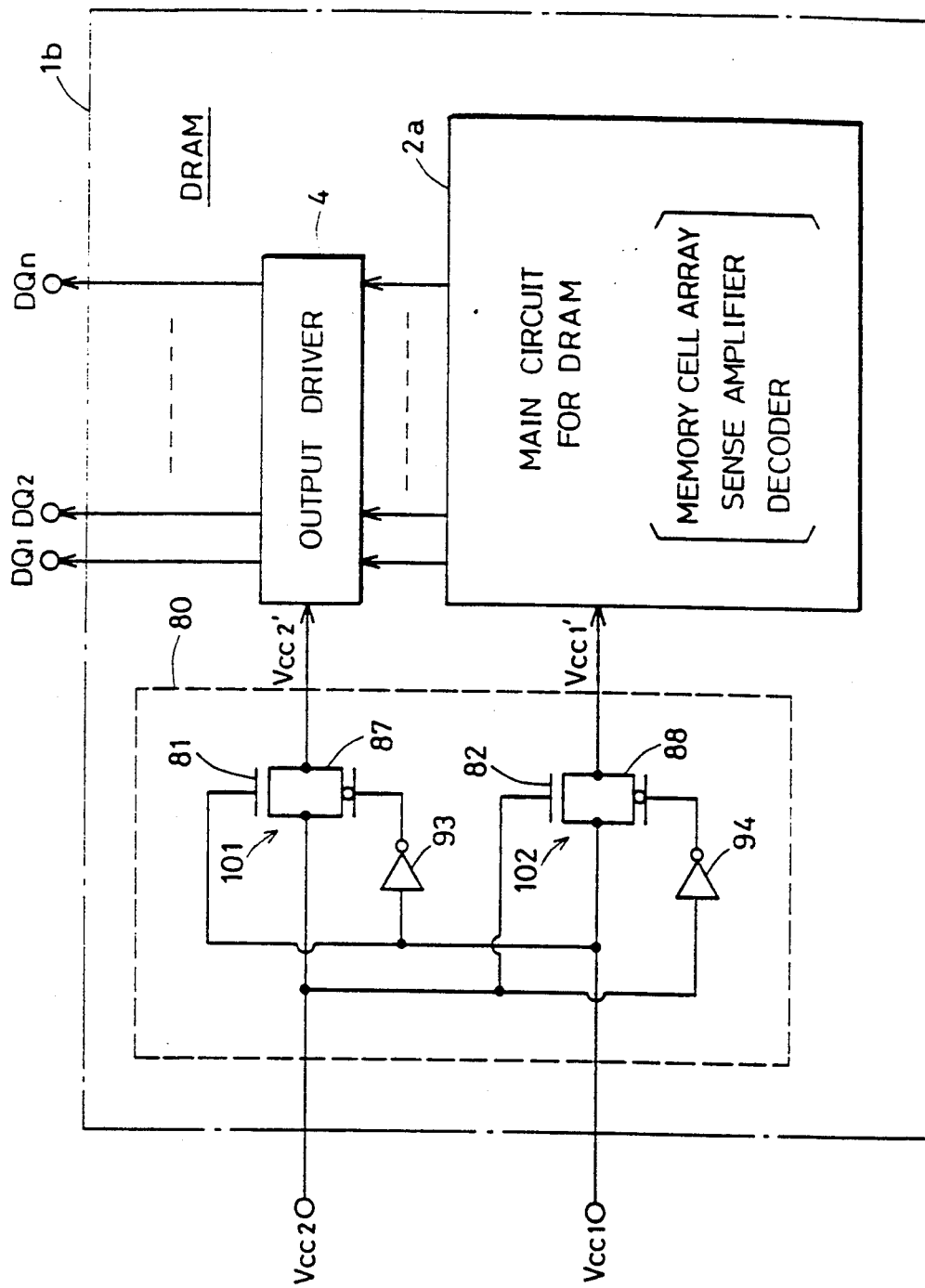
FIG. 1 is a circuit diagram of a timing coinciding circuit shown in FIG. 2.

FIG. 1 shows a timing coinciding circuit 80 shown in FIG. 2. Referring to FIG. 1, timing coinciding circuit 80 comprises a transmission gate 102 connected between a first power supply voltage terminal Vcc 1 and a main circuit 2a, and a transmission gate 101 connected between a second power supply voltage-terminal Vcc 2 and an output driver 4. Transmission gate 102 comprises a parallel connection of an NMOS transistor 82 and a PMOS transistor 88. Transmission gate 101 comprises parallel connection of an NMOS transistor 81 and a PMOS transistor 87. Transistor 82 has the gate connected to second power supply voltage terminal Vcc 2. Transistor 88 has the gate connected to terminal Vcc 2 through an inverter 94. Transistor 81 has the gate connected to first power supply voltage terminal Vcc 1. Transistor 87 has the gate connected to terminal Vcc 1 through an inverter 93. First and second power supply voltages are applied to inverters 93 and 94, respectively. Power supply voltages Vcc 1' and Vcc 2' having their supply-timing coincided to each other are provided through transmission gates 102 and 101. They are respectively supplied to main circuit 2a and output driver 4.

Figure 3:
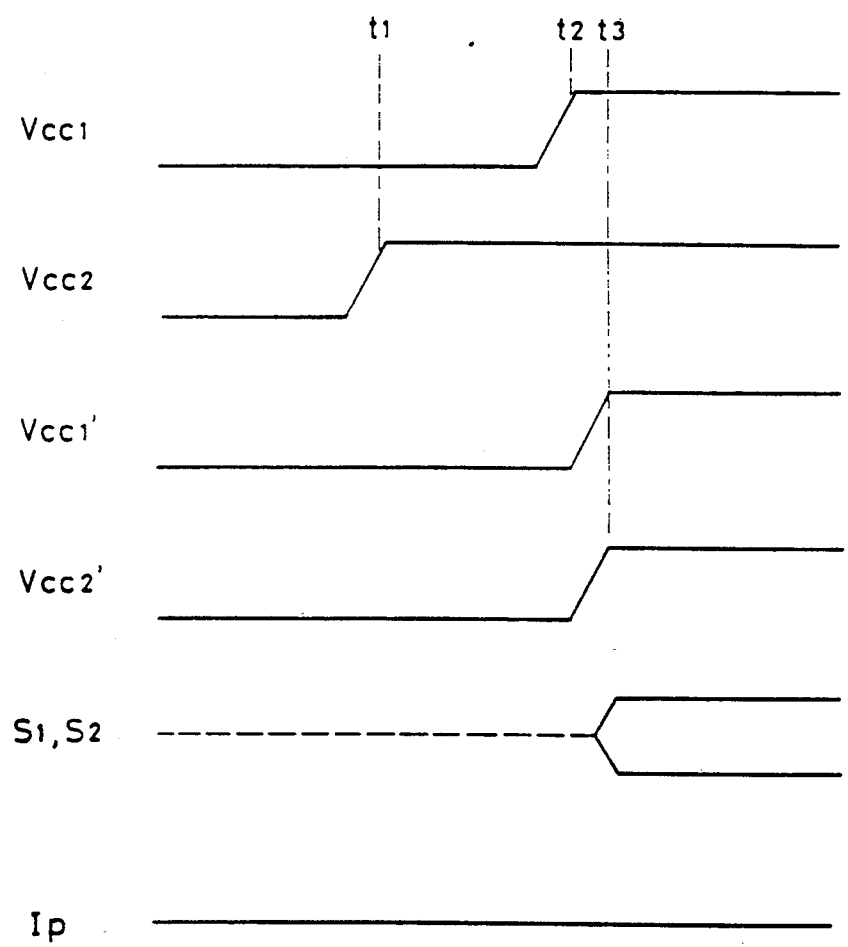
FIG. 3 is a timing chart for describing the operation of the timing coinciding circuit shown in FIG. 1 when the supply of a power supply voltage starts.

FIG. 3 is a timing chart for describing the operation of a timing coinciding circuit 80 shown in FIG. 1 when the supply of power supply voltages Vcc 1 and Vcc 2 starts i.e., supply-start timing. Referring to FIGS. 1 and 3, the supply of second power supply voltage Vcc 2 starts at the time t1, and thereafter, the supply of first power supply voltage Vcc 1 starts at the time t2. In the period from the time t1 to t2, the transistors 82 and 88 are turned on in response to a high level power supply voltage Vcc 2, but transistors 81 and 87 are turned off since power supply voltage Vcc 1 is not applied. As a result, power supply voltage Vcc 2 is not applied to output driver 4 in this period, that is, a low level output power supply voltage Vcc 2' is provided.

Figure 8:
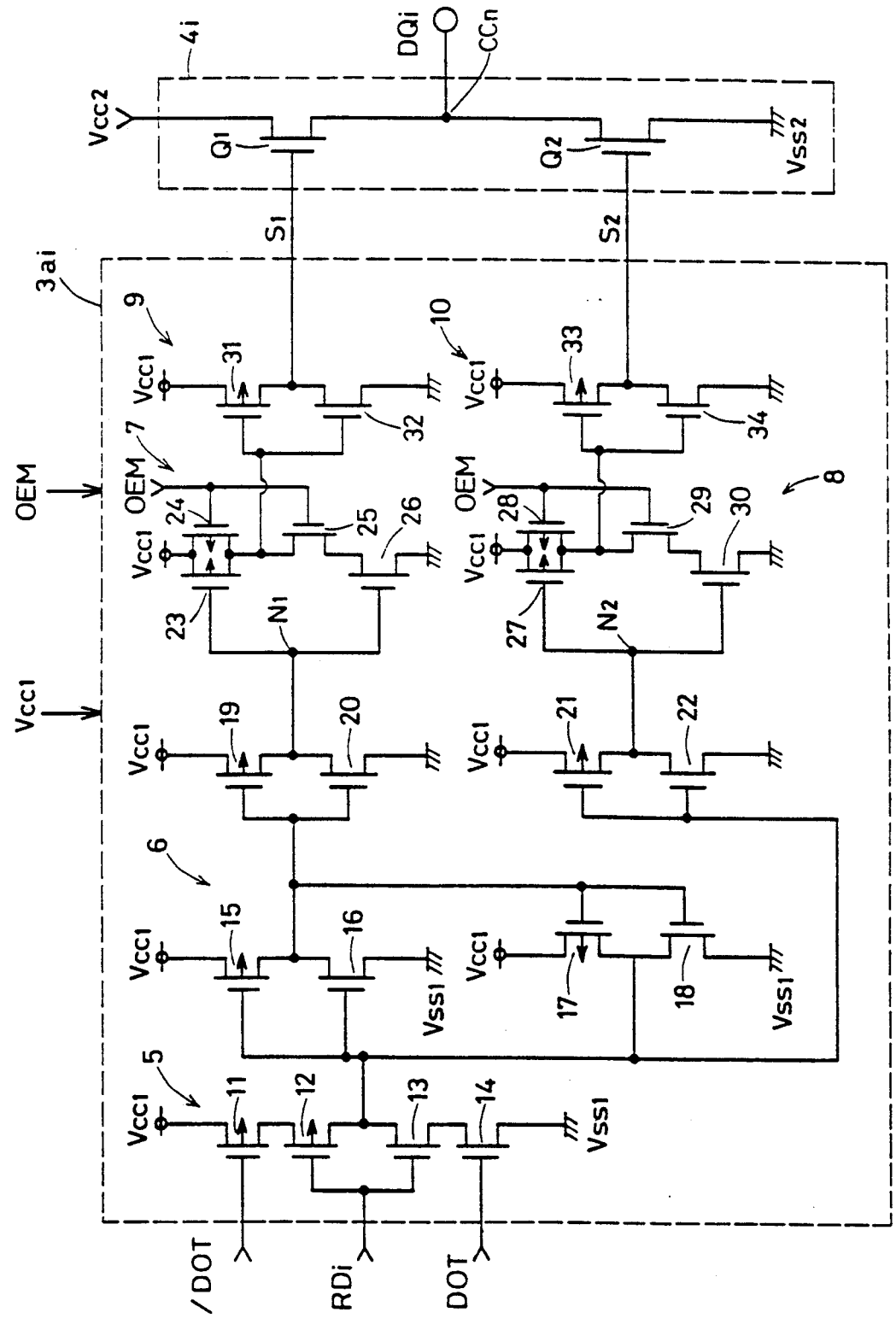
FIG. 8 is a circuit diagram of an output main amplifier circuit and an output driving circuit provided in the output buffer circuit shown in FIG. 7.
Figure 9:
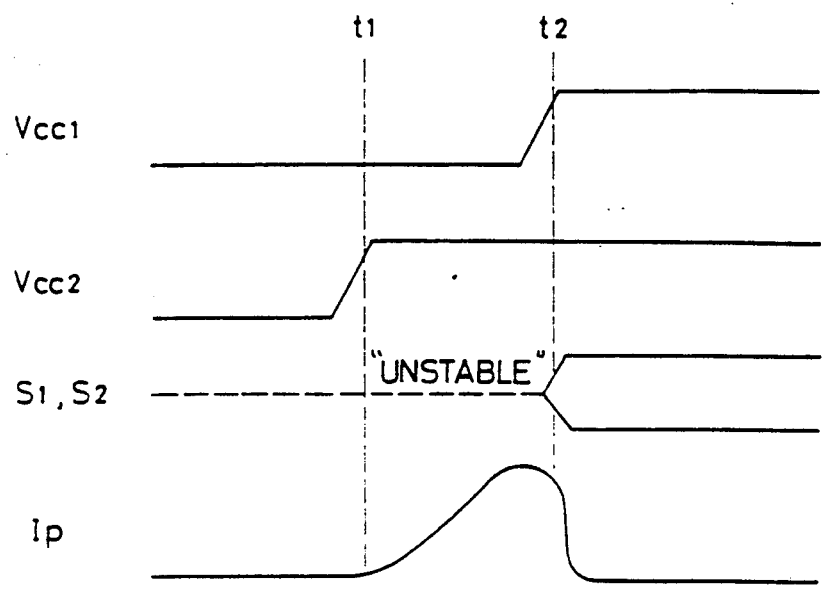
FIG. 9 is a timing chart showing the flow of an excessive penetrating current when the supply of the power supply voltage starts.
Figure 10:
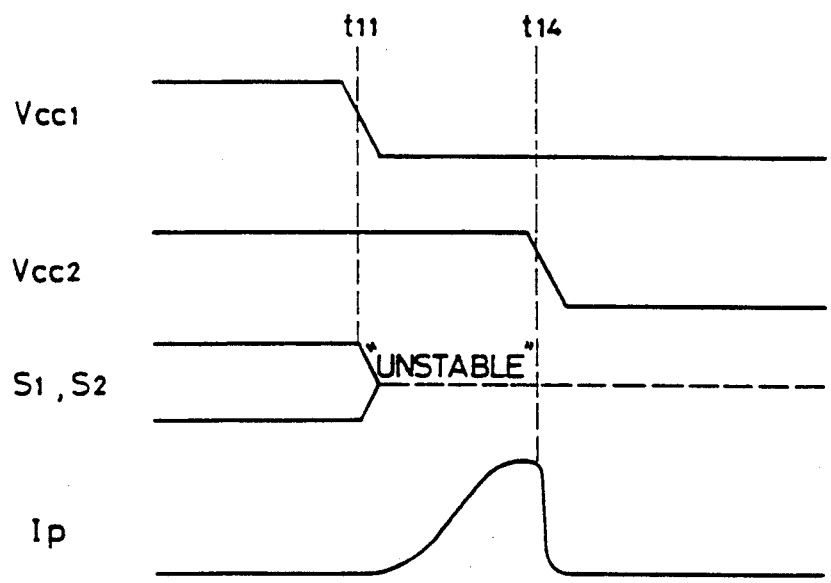
FIG. 10 is a timing chart showing the flow of an excessive penetrating current when the supply of the power supply voltage ends.

After the time t2, transistors 81 and 87 also turn on because power supply voltage Vcc 1 rises. Therefore, power supply voltages Vcc 1 and Vcc 2 are applied to main circuit 2a and output driver 4, respectively, through transmission gates 102 and 101 as output power supply voltages Vcc 1' and Vcc 2'. Since output power supply voltages Vcc 1' and Vcc 2' are established at the time t3, the potential of output signals S1 and S2 of the output main amplifier circuit 3ai shown in FIG. 8 are fixed. Since the apply of output power supply voltages Vcc 1' and Vcc 2' to main circuit 2a and output driver 4 simultaneously start, an excessive current consumption in output driver 4 caused by the unstable potential of output signals S1 and S2 is avoided.

Figure 4:
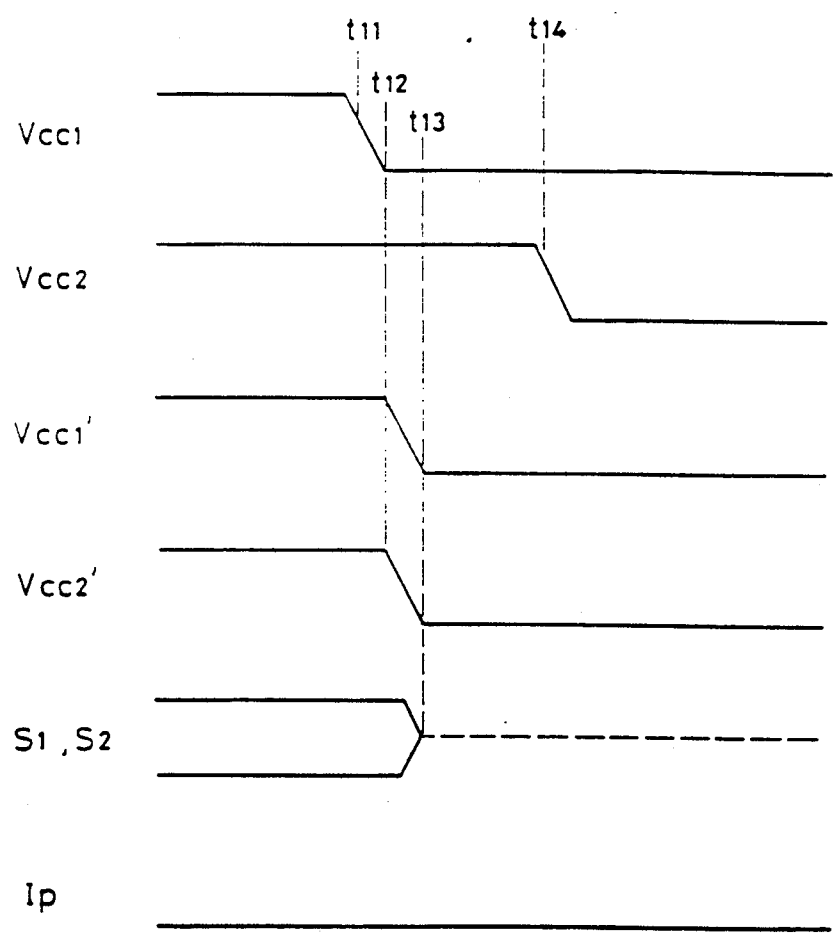
FIG. 4 is a timing chart for describing the operation of the timing coinciding circuit shown in FIG. 1 when the supply of the power supply voltage ends.

FIG. 4 is a timing chart for describing the operation of a timing coinciding circuit 80 shown in FIG. 1 when the supply of power supply voltages Vcc 1 and Vcc 2 ends i.e., supply-end timing. Referring to FIG. 4, after the fall of first power supply voltage Vcc 1 at the time t11, second power supply voltage Vcc 2 rises at the time t14. -Since power supply voltages Vcc 1 and Vcc 2 are at the high level until the time t11, two transmission gates 102 and 101 are turned on. Accordingly, output power supply voltages Vcc 1' and Vcc 2' are applied to main circuit 2a and output driver 4, respectively. Because power supply voltage Vcc 1 falls after the time t11, transmission gate 101 is turned off. Transmission gate 102 is turned on in the period from the time t11 to the time t14, but it provides a low level output power supply voltage Vcc 1' because power supply voltage Vcc 1 is not applied. In other words, after the rise of first power supply voltage Vcc 1 (the time t11), two output power supply voltages Vcc 1' and Vcc 2' almost simultaneously fall within a short time. As a result, after the time t13, although output signals S1 and S2 of output main amplifier circuit 3ai indicate an unstable potential, penetrating current Ip does not flow in output driver circuit 4 because output power supply voltages Vcc 1' and Vcc 2' are not applied in main circuit 2a and output driver 4 by newly provided timing coinciding circuit 80. That is, either when the supply of power supply voltages Vcc 1 and Vcc 2 start in different timing as shown in FIG. 3, or when the supply of power supply voltages Vcc 1 and Vcc 2 end in different timing, the supply of output power supply voltages Vcc 1' and Vcc 2' to main circuit 2a and output-driver 4 simultaneously start and end. Accordingly, undesired current consumption is avoided by unstable output signals S1 and S2 provided from output main amplifier circuit 3ai. Furthermore, output driver circuit 4 is prevented from being destroyed by an excessive flow of the penetrating current.

Figure 5:
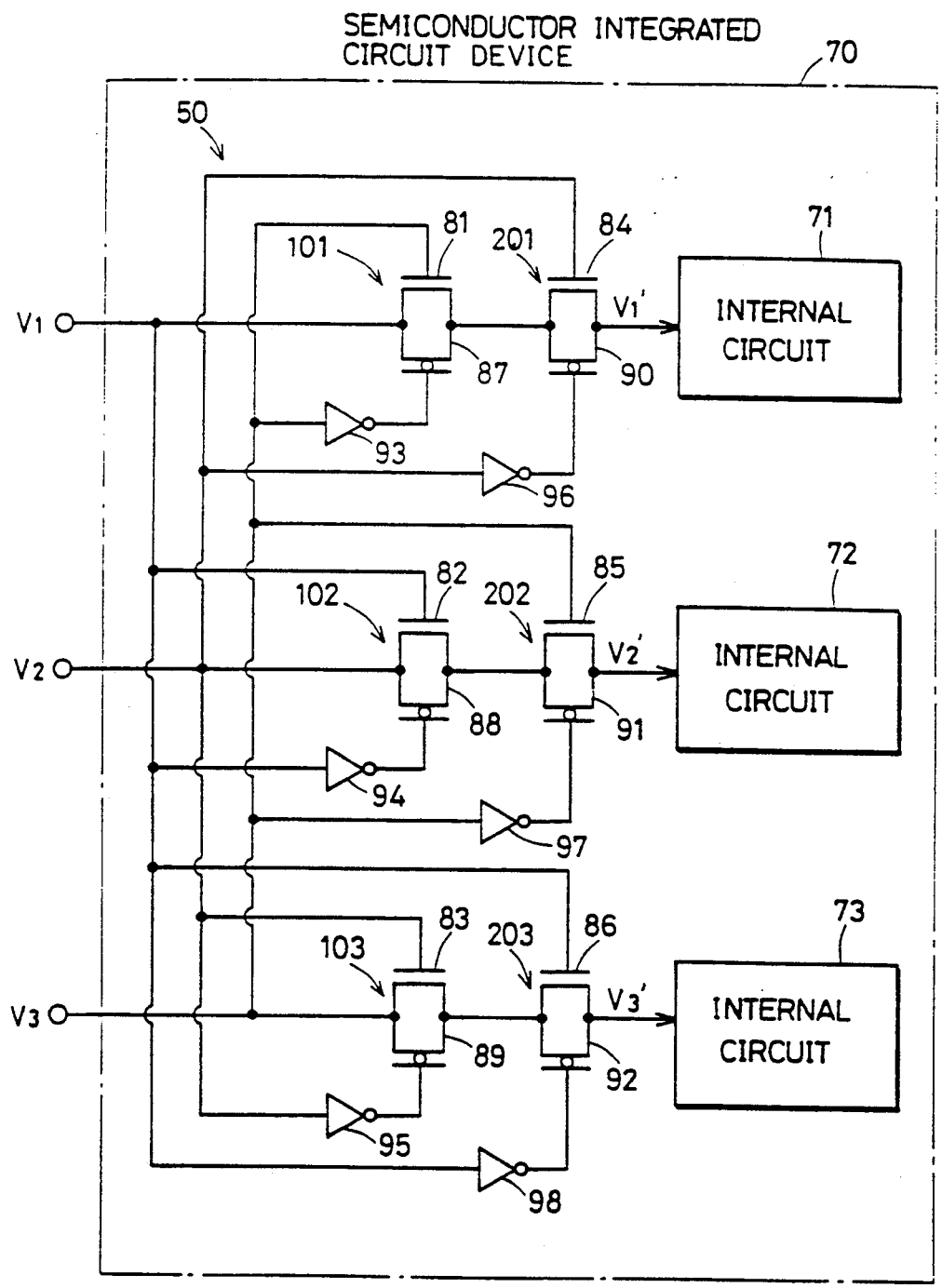
FIG. 5 is a block diagram of a semiconductor integrated circuit device showing another embodiment of the present invention.

FIG. 5 is a block diagram of a semiconductor integrated circuit device 70 showing another embodiment of the present invention. In the above description, the case when the present invention is applied in a DRAM as one example is described, but the present invention is applicable in a general semiconductor integrated circuit device. Referring to FIG. 5, semiconductor integrated circuit device 70 comprises internal circuits 71 to 73, respectively energized by the externally applied three power supply voltages V1 to V3. A timing coinciding circuit 50 is provided between power supply voltage terminals V1 to V3 and internal circuits 71 to 73. Timing coinciding circuit 50 comprises transmission gates 101 and 201 connected between power supply voltage terminal V1 and internal circuit 71, transmission gates 102 and 202 connected between power supply voltage terminal V2 and internal circuit 72, and transmission gates 103 and 203 connected between power supply voltage terminal V3 and internal circuit 73. Transmission gate 101 is operated in response to power supply voltage V3. Transmission gate 201 is operated in response to power supply voltage V2. Transmission gate 102 is operated in response to power supply voltage V1. Transmission gate 202 is operated in response to power supply voltage V3. Transmission gate 103 is operated in response to power supply voltage V2. Transmission gate 203 is operated in response to power supply voltage V1.

Figure 6:
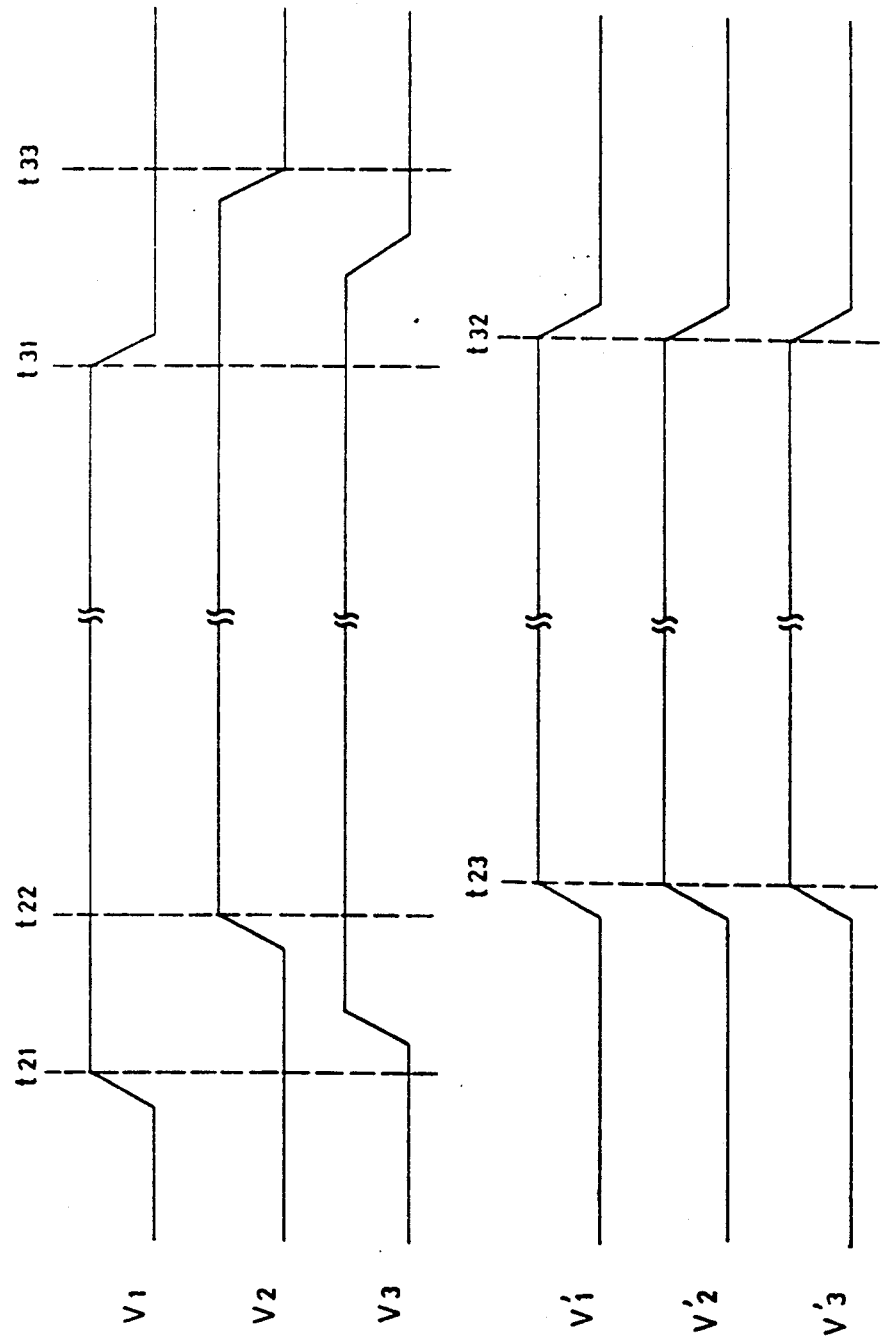
FIG. 6 is a timing chart for describing the operation of the timing coinciding circuit shown in FIG. 5.

FIG. 6 is a timing chart for describing the operation of a timing coinciding circuit 50 shown in FIG. 5. Referring to FIG. 6, after the rise of power supply voltage V1 at the time t21, power supply voltage V3 rises, and power supply voltage V2 rises at the time t22. The supply of three power supply voltages V1 to V3 start in different timing as shown in FIG. 6. Since timing coinciding circuit 50 shown in FIG. 5 operates in the same manner as the circuit 80 shown in FIG. 1, supply-timing of the output power supply voltages V1' to V3' simultaneously rise. That is, the established output power supply voltages V1' to V3' are simultaneously applied to the internal circuits 71 to 73, respectively, at the time t23 after the time t22.

After the fall of power supply voltage V1 at the time t31, power supply voltage V3 falls, and power supply voltage V2 also falls at the time t33. In this case also, since timing coinciding circuit 50 operates in the same manner as the circuit 80 shown in FIG. 1, three output power supply voltages V1' to V3' simultaneously fall. That is, the supply of power supply voltages V1 to V3 end in different timing, while the supply of output power supply voltages V1' to V3' to internal circuits 71 to 73 simultaneously end (at the time t32).

Therefore, even when the supply of externally applied power supply voltages V1 to V3 start and end in different timing, the supply of output power supply voltages V1' to V3' to internal circuits 71 to 73 is carried out simultaneously because timing coinciding circuit 50 is provided. The necessity to apply a plurality of power supply voltages simultaneously may differ depending on the type of the semiconductor integrated circuit device. However, simultaneous application of a plurality of power supplies is often necessary in various circuits as in the DRAM. Timing coinciding circuit 50 shown in FIG. 5 handles three power supply voltages V1 to V3, but it should be clear that the timing coinciding circuit which can handle three or more power supply voltages can be easily structured by those skilled in art.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor integrated circuit device including first and second internal circuits, respectively energized by externally applied at least first and second power supply voltages, wherein said second internal circuit has a tendency to consume much current in response to an unstable output signal provided from said first internal circuit when said second power supply voltage only is applied, comprising:

timing coinciding means responsive to the supply-timing of one of the first and second voltages for making the other supply-timing of the first and second power supply voltages coincide with said one, wherein said first and second power supply voltages are applied to said first and second internal circuits, respectively, through said timing coinciding means.

2. The semiconductor integrated circuit device according to claim 1, wherein said timing coinciding means comprises means responsive to supply-start timing of delayed one of said first and second power supply voltages for delaying the other preceding one of said first and second power supply voltages.

3. The semiconductor integrated circuit device according to claim 1, wherein said timing coinciding means comprises means responsive to supply-end timing of preceding one of said first and second power supply voltages for making earlier supply-end timing of the other delayed one of said first and second power supply voltages.

4. The semiconductor integrated circuit device according to claim 1, wherein said second internal circuit comprises driving circuit means for driving an externally provided load in response to an output-signal provided from said first internal circuit, said driving circuit means having a tendency to consume much current in response to the unstable output signal provided from said first internal circuit when said second power supply voltage only is applied.

5. The semiconductor integrated circuit device according to claim 1, wherein said timing coinciding means includes;

a first power supply voltage input terminal for receiving said first power supply voltage, a second power supply voltage input terminal for receiving said second power supply voltage, first switching means connected between said first power supply input terminal and first internal circuit being operated in response to the voltage applied to said second power supply voltage input terminal, and second switching means connected between said second power supply voltage input terminal and second internal circuit being operated in response to the voltage applied to said first power supply voltage input terminal.

6. The semiconductor integrated circuit device according to claim 5, wherein said first switching means comprises a first transmission gate connected between said first power supply voltage input terminal and first internal circuit, and being turned on in response to a high level voltage applied to said second power supply voltage input terminal; and said second switching means comprises second transmission gate connected between said second power supply voltage terminal and second internal circuit, and being turned on in response to a high level voltage applied to said first power supply voltage input terminal.

7. The semiconductor integrated circuit device according to claim 4, wherein said driving circuit means comprises a plurality of switching elements connected in series between said second power supply voltage and the ground and being operated in response to the output signal provided from said first internal circuit; and said load is connected to a common connection node of said plurality of switching elements.

8. A semiconductor memory device energized by externally applied at least first and second power supply voltages, comprising:

data storing means supplied with said first power supply voltage for storing a data signal;

data read out means supplied with said first power supply voltage for reading out the data signal stored in said data storing means in response to an externally applied read out control signal;

data output terminals for providing the data signal read out from said data read out means;

driving circuit means supplied with said second power supply voltage for driving said data output terminals in response to the data signal read out by said data reading out means, said driving circuit means has a tendency to consume much current in response to an unstable output signal provided from said data read out means when said second power supply voltage only is applied; and timing coinciding means responsive to the supply-timing of one of the first and second voltages received for making the other supply-timing of the first and second power supply voltages coincide with said one, said first and second power supply voltages being respectively applied to said data storing means and data read out means, and said driving circuit means through said timing coinciding means.

9. The semiconductor memory device according to claim 8, wherein said data storing means comprises a memory cell array including memory cells for storing data signals;

said externally applied read out control signal comprises an externally applied address signal for addressing one of the memory cells in said memory cell array, said data read out means comprises
memory cell designating means for designating one of the memory cells in said memory cell array in response to said address signal;

sense amplifier means for amplifying a data signal stored in one of the memory cells designated by said memory cell designating means;

output main amplifier circuit means for amplifying a data signal amplified by said sense amplifier means, said first power supply voltage being applied to said memory cell designating means, sense amplifier means, and output main amplifier circuit means.

10. The semiconductor memory device according to claim 9,
wherein said memory cell designating means comprises decoder means for designating a row and a column in the memory cell array in response to said externally applied address signal.

11. The semiconductor memory device according to claim 8, wherein said semiconductor memory device has a multi-bits configuration for simultaneously handling n-bits of data signals.

12. The semiconductor memory device according to claim 8, wherein said semiconductor memory device comprises a dynamic random access memory device.

* * * * *